(12) United States Patent
Hlotyak et al.

(10) Patent No.: US 7,253,607 B2
(45) Date of Patent: Aug. 7, 2007

(54) SITE-AWARE OBJECTS

(75) Inventors: Stephen J. Hlotyak, Belmont, MA (US); Randall B. Stimson, Boston, MA (US); Daniel P. Thornton, Medfield, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/192,927

(22) Filed: Jul. 29, 2005

(65) Prior Publication Data
US 2006/0244474 A1      Nov. 2, 2006

Related U.S. Application Data

(60) Provisional application No. 60/676,005, filed on Apr. 29, 2005.

(51) Int. Cl.
*G01R 31/28* (2006.01)
(52) U.S. Cl. .................................. 324/158.1
(58) Field of Classification Search ............... 324/765, 324/158.1, 760; 702/118, 127, 108; 714/38
See application file for complete search history.

(56) References Cited

U.S. PATENT DOCUMENTS 5,845,234 A * 12/1998 Testa et al. ................. 702/119
6,941,232 B2 * 9/2005 Burke et al. .................. 702/57
2004/0225465 A1 * 11/2004 Pramanick et al. ......... 702/119
2005/0154551 A1   7/2005 Pramanick et al.
2005/0261856 A1 * 11/2005 Kushnick et al. ........... 702/117

OTHER PUBLICATIONS

International Search Report for Application No. PCT/US06/13546, dated Apr. 12, 2006.
Written Opinion for Application No. PCT/US06/13546, dated Apr. 12, 2006.
International Preliminary Examination Report for Application No. PCT/US2006/13546.

* cited by examiner

*Primary Examiner*—Ha Tran Nguyen
*Assistant Examiner*—Tung X. Nguyen
(74) *Attorney, Agent, or Firm*—Fish & Richardson P.C.

(57) ABSTRACT

A method for use with automatic test equipment (ATE) having sites, each which accommodates a device under test (DUT), includes defining an object for use with the plural sites, where the object is to contain data associated with at least some of the plural sites, and where the object determines which sites are active. The method also includes using the object during testing of DUTs by the ATE.

18 Claims, 3 Drawing Sheets

SITE-AWARE OBJECTS

CLAIM TO PRIORITY

This patent application claims priority to U.S. Provisional Application No. 60/676,005, filed on Apr. 29, 2005, the contents of which are hereby incorporated by reference into this application as if set forth herein in full.

TECHNICAL FIELD

This patent application relates generally to automatic test equipment (ATE) having multiple sites that are used to test multiple devices and, more particularly, to site-aware objects that are used by the ATE in testing the multiple devices.

BACKGROUND

ATE refers to an automated, usually computer-driven, approach to testing devices, such as semiconductors, electronic circuits, and printed circuit board assemblies. A device tested by ATE, such as a semiconductor device, is referred to as a device under test (DUT).

Modern ATEs support multi-site testing. ATEs that support multi-site testing include slots, or "sites". A device to be tested inserts into each site, and the ATE performs whatever tests are necessary on the device in the site. Computer programs are typically involved in the testing. The ability to test devices at multiple sites without changing code in these computer programs is referred to as "site transparency". In more detail, site transparency refers to automatic management of sites and site data such that users have little responsibility for such tasks, and barely need consider the fact that their testing is multi-site until required to do so. If effective, users will not be continuously conscious of the site dimensionality of their programming.

Site transparency is a significant advantage in ATEs because it enables a user to configure multiple devices being tested without significant modifications to test program code.

SUMMARY

This application describes apparatus and methods, including computer program products, for implementing site-aware objects.

In general, in one aspect, the invention is directed to a method for use with automatic test equipment (ATE) having sites, where each of the sites accommodates a device under test (DUT). The method includes defining an object for use with the plural sites, where the object contains data associated with at least some of the plural sites, and where the object determines which sites are active, and using the object during testing of DUTs by the ATE. This aspect may also include one or more of the following features.

The ATE may include an associated ATE software site management infrastructure for managing the sites. The object may communicate with the ATE software site management infrastructure to determine which sites are active. Using the object during testing may include one or more of: programming the ATE via the object, storing instrument readings from the ATE in the object, processing the instrument readings using the object, and recording test results in the object. Processing may include changing the instrument readings and/or reporting the readings to a testing subsystem.

The object may be defined in a programming language. The object may be treated by the programming language as a single data element is treated in the programming language. The data may include Boolean data that identifies which sites are active. The data may include pin list data. The pin list data may include pin data corresponding to instrument measurements on individual pins of at least one DUT.

The object may be defined in a programming language, and the method may also include defining an operation in the programming language, where the operation is specific to the object. The operation may include a mathematical operation that corresponds to a mathematical operation performed on a native variable in the programming language.

In general, in another aspect, the invention is directed to a system that includes ATE having sites, where each of the sites is configured to accommodate a DUT, and a processing device in communication with the ATE. The processing device executes instructions to perform the method of the foregoing aspect. This aspect may also include the same, or different, features from the foregoing aspect.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
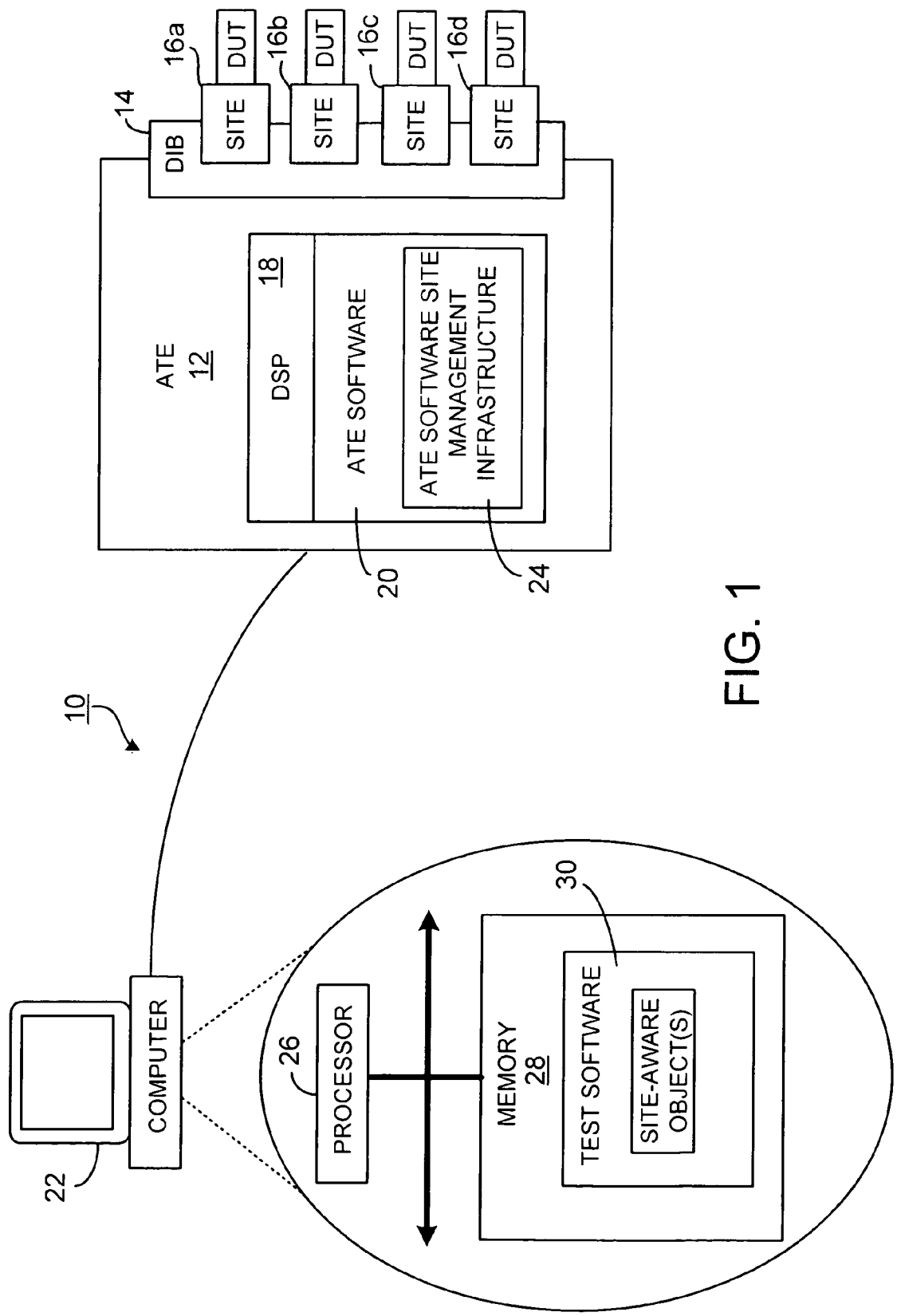
FIG. 1 is a block diagram of an ATE system.

FIG. 1 shows a system 10 for use in testing multiple DUTs. System 10 includes an ATE 12. ATE 12 includes a device interface board (DIB) 14, that is used to connect devices to the ATE. DIB 14 has multiple sites 16a to 16d. A DUT may be inserted into each site for testing using the ATE. Although only four sites are shown in FIG. 1, ATE 12 may include any number of sites. Also, in the example of FIG. 1, there is one DUT per slot, however, it is not a requirement that all the sites be occupied.

Each DUT may be any type of device that can be tested using an ATE, examples of which include, but are not limited to, semiconductor devices and electronic assemblies.

ATE 12 includes an internal processing device, such as digital signal processor (DSP) 18. DSP 18 may execute all or part of ATE software 20, i.e., computer program(s) comprised of executable code, to test the DUTs in sites 16a to 16d. ATE software 20 may be stored in memory (not shown) on ATE 12, or may be provided from an external processing device, such as computer 22 described below. ATE software 20 includes an ATE software site management infrastructure 24 that manages sites 16a to 16d.

Among other things, the ATE software site management infrastructure controls the exchange of information between ATE software 20 and sites 16a to 16d. This information can include data from a DUT in a site and/or data to be sent to a DUT in a site. Examples of data to the DUT include, but are not limited to, test data such as waveforms or other stimuli, and configuration data that is used by ATE software 20 to program the DUT (it is noted that, in one embodiment, the DSP only processes signals from the DUT). Examples of the data from a DUT include, but are not limited to, an indication as to whether a site is active or not, and readings from a DUT in the site, including readings from individual pins in the DUT. It is noted that a site may be deemed inactive if that site has binned-out, meaning that the DUT in the site has completed and passed all necessary tests or that the DUT has failed one or more necessary tests. In either case, no further testing is done. Alternatively, a site may be deemed inactive if there is no DUT in the site or if the site has been designated inactive by an administrator running the tests.

ATE 12 is in communication with computer 22. Computer 22 may be any type of processing device including, but not limited to, a conventional personal computer (PC), a desktop device or a hand-held device, a multiprocessor computer, a microprocessor-based or programmable consumer electronics device, a mini-computer, a mainframe computer, and/or a personal mobile computing device. In the example of FIG. 1, computer 22 contains one or more processors, referred to simply as "processor 26", and memory 28. Memory 28 stores test software 30 that is executed by processor 26 to test DUTs in ATE 12. During testing, test software 30 interacts with ATE software 20, including the ATE software site management infrastructure described above. For example, test software 30 may control testing by instructing ATE software 20 to provide test data to DUTs at sites 16*a* to 16*d*, and to report the results of such tests back to test software 30 or to a designated subsystem. To this end, test software 30 may generate one or more graphical user interfaces (GUIs) (not shown), through which an administrator may control testing on ATE 12.

Heretofore, test software on computer 22 operated in conjunction with an interactive graphical environment called the procedural development environment (PDE). The PDE contained code to implement site transparency, thereby allowing test software developers to focus on process flow. Resulting test software was thus dependent upon the PDE. System 10, however, need not include the PDE. Instead, test software 30 makes use of site-aware objects (described below) to implement site transparency during testing.

In this embodiment, test software 30 is written in Visual Basic for Applications (Visual Basic). Visual Basic is a high level programming language that evolved from an earlier DOS version called Basic. Visual Basic is a visual and events-driven programming language. This is its main divergence from the earlier Basic. In Basic, programming is performed in a text-only environment and programs are executed sequentially. In Visual Basic, programming is performed in a graphical environment using objects.

An object is a self-contained entity that contains both data and code that is executed to manipulate the data. Because users may select objects randomly in Visual Basic, each object is programmed independently to be able to respond to such actions. A Visual Basic program thus may be made up of numerous subprograms, each of which has its own program code, and each of which can be executed independently and at the same time as other subprograms.

The site-aware objects used by ATE 12 are data objects that are designed to represent multi-site data. Such data might be used to program ATE instruments, hold measured readings, manipulate those readings, and/or report those readings to subsystems responsible for dispositioning a DUT (e.g., binning) and recording test results (datalog). Site-aware objects take their name from the fact that they are internally connected to ATE software site management infrastructure 24 and are, therefore, aware of changes to the ATE's system site context over time, e.g., periodic changes detected every hour, minute, second, etc. Site-aware objects present two seemingly conflicting models to a user. Site-aware objects allow the user to write test code while essentially ignoring the concept of sites, while allowing users to access site-specific data when needed.

Figure 2:
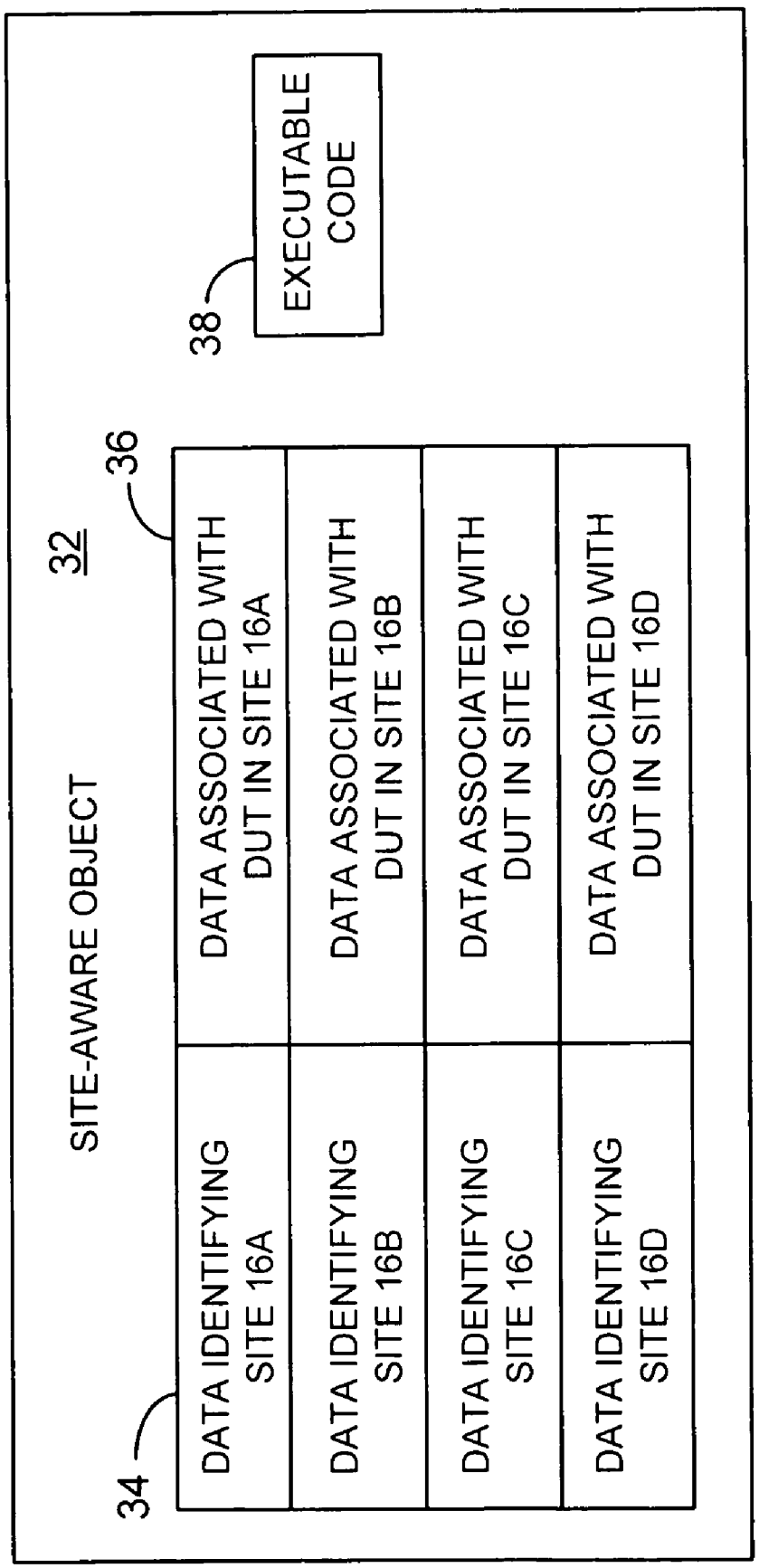
FIG. 2 is a diagram of a site-aware object.

Referring to FIG. 2, in this embodiment, a site-aware object 32 contains data 34 identifying each of sites 16*a* to 16*d* on DIB 14. Site-aware object 34 also contains data 36 associated with a DUT at each of the sites. The data associated with the DUTs may be data received from a DUT, such as readings, test results, or the like; or data to transfer to a DUT, such as program information, test data, or the like.

Site-aware object 32 is similar to an array in the sense that site aware object 32 correlates sites to data associated with DUTs in those sites. Site-aware object 32 is different from an array, however, in that site-aware object 32 knows which sites are active/inactive during testing. To this end, site-aware object 32 also contains executable code 38 that is used to communicate with ATE software site management infrastructure 24 in order to determine which sites 16*a* to 16*d* are active/inactive, to update its stored data accordingly, and to communicate with test software 30.

In this embodiment, site-aware objects are used in Visual Basic. It is noted, however, that site-aware objects are not limited to use in a Visual Basic context; they may be implemented in any programming language. The following description, however, applies to site-aware objects that are used with Visual Basic.

In Visual Basic, the most general-purpose variable type is the Variant. This variable type is designed to hold any other variable type that can be used in a Visual Basic programming environment. In this embodiment, a site-aware equivalent to the Variant, called the SiteVariant, is defined. The SiteVariant can hold any type of multi-site values.

The behavior of the SiteVariant object can be summarized as follows. A SiteVariant object contains data for multiple sites. The data can be site-uniform, if assigned a single scalar value in a single assignment statement, or site-specific, if returned by a measurement. A SiteVariant object is "site-aware." When used, it knows whether the test program is currently in a site loop, in which only one site is currently selected. A SiteVariant object can be used like any other Visual Basic scalar when it is in a site loop (and a single site is selected) or when it is site-uniform (and it has a single scalar value for all sites). Otherwise, when it is outside a site loop and holds site-specific data, it is treated as multisite. The following code demonstrates the dual functionality of Site Variants depending on whether they hold multisite data, and whether they are used inside or outside a site loop. The use of Debug.Print in the following example is a proxy for any usage that requires a single scalar variable. In this example, a double-letter variable name like YY denotes that it holds multisite data. Single-letter variable names like X hold a scalar, and act just like a standard Visual Basic Double in this example.

```
Dim Site As Variant
Dim X As New SiteDouble
Dim YY As New SiteDouble
X = 2.5 'Variable holds one number -- same number for all sites
Debug.Print X 'Prints 2.5
YY = thehdw.DCVI.Pins("Vdd").Meter.Read 'Meter Read returns site-
specific data
    -- a separate value for each site.
Debug.Print YY ' Runtime Error: "Object contains site-specific data"
```

```
For Each Site In theExec.Sites
   Debug.Print Site
   Debug.Print YY 'Works here. Object always evaluates to a scalar in a
   site loop
Next Site
```

A SiteVariant is either site-uniform or site-specific. "Site-uniform" means that all sites share one common value from a single assignment. "Site-specific" means that each site has its own value. Note that these terms refer to sharing a single value, not to the numeric equivalence of the values. For example, if a site loop assigned 5.0 to all sites in a SiteDouble, it would still be site-specific even though all sites had the same value.

More specific object types may be derived from SiteVariant to hold specific Visual Basic variable types. These object types may correspond to variable types that are native to Visual Basic. Examples of these more specific object types include SiteDouble, SiteBoolean, SiteLong, and PinData. The object types SiteDouble, SiteBoolean, and SiteLong represent SiteVariant data that corresponds, respectively, to native Visual Basic types Double (64-bit precision floating-point numbers), Boolean (logical true or false), and Long (32-bit integer). PinData extends SiteVariant to include device-pin-related properties such as a pin name and channel identifier. PinData is used in a PinListData collection class which encapsulates multi-pin, multi-site instrument readings. That is, PinListData identifies individual pins of a DUT and data values associated with measurements for each of those individual pins for multiple sites and active sites.

More specifically, the PinListData object has been integrated into the new SiteVariant use model. The PinListData object adds a pin dimension to multisite data. As such, it can be considered a matrix containing data for each Pin and Site. It holds PinData objects, one for each pin. Each pin slice of a PinListData is a SiteVariant with a pin name. It is called a PinData object. In fact, any PinListData object that contains a single pin can be used as a SiteVariant, or as one of its more specific derivatives if the data type held matches the derivative's data type. For this reason, users no longer need to use PinListData objects if their driver syntax contains a single pin. For example, users have the option of putting a single-pin measurement directly into a SiteDouble. The PinListData object, because it holds SiteVariants, has the same site-aware behavior and same site-uniform/site-specific attributes. While PinListData legacy syntax will still function, much of the syntax is being hidden in favor of an interface that is consistent with the SiteVariant model. PinListData math methods are provided to perform math on multiple sites and multiple pins with a single call. The following code takes meter measurements on three pairs of pins on four sites, then datalogs the delta between all pairs on all sites with a single statement:

```
Dim HighReading As New PinListData
Dim LowReading As New PinListData
Dim Delta As New PinListData
HighReading = thehdw.DCVI.Pins("A_pos, B_pos, C_pos").Meter.Read
LowReading = thehdw.DCVI.Pins("A_neg, B_neg, C_neg").Meter.Read
Delta = HighReading.Subtract(LowReading)
TheExec.Flow.TestLimit Delta
```

The foregoing object types are not the only types that can be derived. Any type that may appear in a Variant can form the basis for a derivation of SiteVariant. These types may include, but are not limited to, user defined types and non-native Visual Basic types.

Site-aware objects mimic, to the extent possible, the behavior of their counterpart Visual Basic types. As such, the programming model for SiteVariant is nearly the same as the programming model for Variant, SiteDouble for Double, etc. One distinction between the object types and native types is that objects types are defined and allocated. Another distinction is that, in Visual Basic, most mathematical operations on native types involve the use of symbolic operators, e.g., '+', '−', '*', '/'. The programming interface for site-aware objects, however, defines methods corresponding to these operators.

More specifically, using the Visual Basic programming language, it is possible to define operations (e.g., mathematical, logical, etc.) that can be performed on the site-aware objects. These operations correspond to native Visual Basic operations but are defined using code. This is necessary because site-aware objects have a different structure than native Visual Basic variables. By way of example, an addition operation of $$y=x+0.1$$

may be performed on Visual Basic native variables "y" and "x" to add 0.1 to "x" and assign the resulting value to "y". A similar operation may be performed in Visual Basic for the site-aware objects "X" and "Y", but not using the mathematical operator "+". Instead, a function "add" may be defined in Visual Basic for use with site-aware objects. Using this function, it is possible to add a value of 0.1 to each data entry (for a site) in site-aware object "X" and to assign those values to corresponding entries in "Y", as follows $$Y=X.add(0.1)$$

Other operations may be defined using different functions. Using such functions, site-aware objects can be treated by Visual Basic (or other programming language) as a single native data element is treated in Visual Basic (or other programming language). This functionality promotes site transparency, since it allows site-aware objects to be treated, essentially, as Visual Basic objects, thereby allowing programmers to focus on process flow instead of trying to account for the multiple sites in ATE 12.

The foregoing operation definitions are not a limitation inherent to site-aware objects. Rather, the need for operation definition is a characteristic of the Visual Basic programming environment, which does not support operator overloading. In a different programming environment, site-aware objects may have symbolic operator support.

Figure 3:
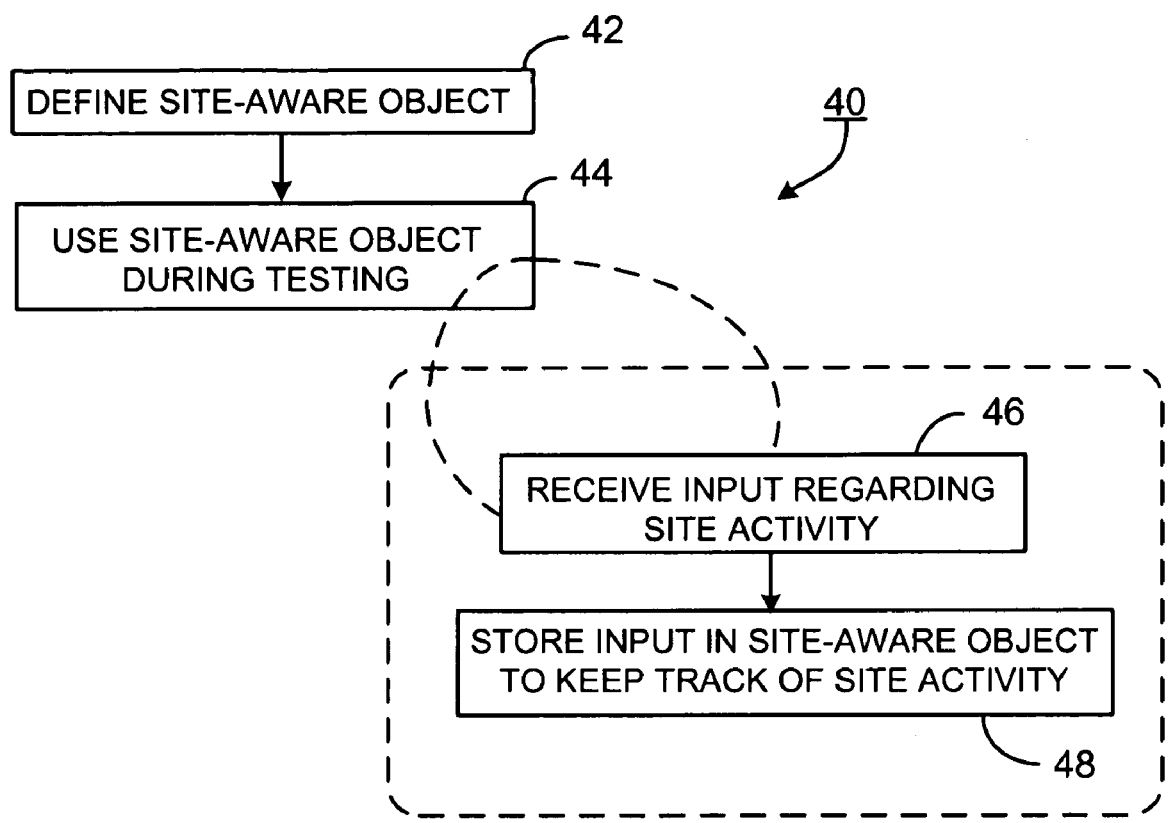
FIG. 3 is a flowchart of a process for using a site aware object during testing.

FIG. 3 shows a process 40 for using ATE 12 with site-aware objects. Process 40 defines (42) a site-aware object for use with sites 16a to 16d. The site-aware object may be defined in accordance with user inputs. The site-aware object is used (44) by ATE 12 during testing of DUTs in sites 16a to 16d. As described above, the site-aware object communicates with the ATE software site management infrastructure 24 to determine which sites are active. In particular, the site-aware object receives (46) an indication that a particular DUT is selected, and stores (48) the indication in the site-aware object.

During testing, the site-aware object may be used for any purpose including, but not limited to, programming the ATE, storing readings from the ATE in the site-aware object, recording test results in the site-aware object, and processing the readings using the site-aware object, including changing the readings and/or reporting the readings to a testing subsystem.

In this embodiment, the SiteVariant objects present as Visual Basic-like scalar variable use model. This is achieved through a combination of Visual Basic features: a default hidden property with an optional parameter, and the ability to Let and Get different types on the same property. Each SiteVariant object has a hidden default property, .Value(), with an optional parameter Site as Long=−1. The default Site parameter invokes the site-aware behavior, taking action on all selected sites or the single selected site in a site loop. Compare the following equivalent syntax (X and Z are SiteDoubles, while y is an ordinary Visual Basic Double):

| Usage: | Equivalent Usage: |
|---|---|
| X = 5 | X.Value(−1) = 5 |
| y = X | y = X.Value(−1) |
| Z = X | Z.Value(−1) = X |

The foregoing are equivalent because Value and −1 are both the defaults.

Making the .Value property the hidden default is more than just a shortcut in this use model. A default mechanism is used to add polymorphic behavior. These SiteVariants act as either numbers or objects, depending on the syntax. When Visual Basic encounters an object with no property or method specified, it can interpret the object as either the object itself or as the result of a call to the object's default property, depending on what type is required in the usage. In the y=X line above, a Double is required by the left hand side. Since X is not a Double, Visual Basic tries the default property for object X and finds that the default property does indeed return a Double. In the Z=X line, on the other hand, Z's default property will accept an object (Variant), so Visual Basic performs a direct assignment of X, the object, into Z. This is possible because Visual Basic allows the Let version of the .Value() property to be a Variant, even though the Get version of the same property is a Double. The simplicity of the default usage, and its consistency with Visual Basic's variables, enables the .Value property to be hidden.

The processes and site-aware objects described herein are not limited to use with any particular hardware, software, or programming language; they may find applicability in any computing or processing environment and with any type of machine that is capable of running machine-readable instructions. All or part of the processes and site-aware objects can be implemented in digital electronic circuitry, or in computer hardware, firmware, software, or in combinations thereof.

All or part of the processes and site-aware objects can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with the processes and site-aware objects can be performed by one or more programmable processors executing one or more computer programs to perform the functions of the processes and site-aware objects. The method steps can also be performed by, and the processes and site-aware objects can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include a processor for executing instructions and one or more storage area devices for storing instructions and data. Generally, a computer will also include, or be operatively coupled to receive data from, or transfer data to, or both, one or more mass storage devices for storing data, e.g., magnetic, magneto-optical disks, or optical disks. Information carriers suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

All or part of the processes and site-aware objects can be implemented in a computing system that includes a back-end component, e.g., as a data server, or that includes a middleware component, e.g., an application server, or that includes a front-end component, e.g., a client computer having a graphical user interface, or any combination of such back-end, middleware, or front-end components. The components of the system can be interconnected by any form or medium of digital data communication, e.g., a communication network. Examples of communication networks include a LAN and a WAN, e.g., the Internet.

Method steps associated with the processes and site-aware objects can be rearranged and/or one or more such steps can be omitted to achieve the same, or similar, results to those described herein.

The processes described herein can be used in the context of a procedural language, rather than with object-oriented programming. For example, site aware objects X, Y, might be defined as follows:

$X$=Instrument.ReadMeasurement(PinA)

$Y$=$X$.Add(0.1)

In a procedural language, such as C, counterparts to X, Y may be implemented using data structures (X, Y below) and external functions (Add()), as follows:

$X$=ReadMeasurement(InstrumentID,PinA)

$Y$=Add($X$, 0.1)

One difference is that in a procedural language, X and Y would only contain the data and there would be external functions, such as Add(), that would perform any processing.

Elements of different embodiments described herein may be combined to form other embodiments not specifically set forth above. Other embodiments not specifically described herein are also within the scope of the following claims.

What is claimed is:

1. A method for use with automatic test equipment (ATE) having a plurality of sites accommodating a plurality of devices under test (DUTs), the method comprising:
defining an object for use with the plurality of sites, the object containing data associated with the plurality of sites and computer code for:
determining activity at active sites among the plurality of sites, the activity indicating that one or more DUTs associated with the active sites are suitable for testing; and
recording changes in activity at the active sites over predetermined periods of time; and
using the object during testing, performed by the ATE, of DUTs associated with active sites.

2. The method of claim 1, wherein the ATE has an associated ATE software site management infrastructure for managing the plurality of sites, the object for communicating with the ATE software site management infrastructure to determine which sites are active.

3. The method of claim 1, wherein using the object during testing comprises one or more of:
programming the ATE via the object;
storing instrument readings from the ATE in the object;
processing the instrument readings using the object; and
recording test results in the object.

4. The method of claim 3, wherein processing comprises changing the instrument readings and/or reporting the readings to a testing subsystem.

5. The method of claim 1, wherein the object is defined in a programming language, the object being treatable by the programming language as a single data element is treated in the programming language.

6. The method of claim 1, wherein the data comprises Boolean data that identifies which sites are active.

7. The method of claim 1, wherein the data comprises pin list data, the pin list data comprising pin data corresponding to instrument measurements on individual pins of at least one DUT.

8. The method of claim 1, wherein the object is defined in a programming language, and the method further comprises:
defining an operation in the programming language, the operation being specific to the object.

9. The method of claim 8, wherein the operation comprises a mathematical operation that corresponds to a mathematical operation performed on a native variable in the programming language.

10. A system comprising:
automatic test equipment (ATE) having a plurality of sites to accommodate a plurality of devices under test (DUTs);
a processing device in communication with the ATE, the processing device executing instructions to:
define an object for use with the plural sites, the object containing data associated with the plurality of sites and computer code for:
determining activity at active sites among the plurality of sites, the activity indicating that one or more DUTs associated with the active sites are suitable for testing; and
recording changes in activity at the active sites over predetermined periods of time; and
use the object during testing, performed by the ATE, of DUTs associated with active sites.

11. The system of claim 10, wherein the ATE comprises an ATE software site management infrastructure for managing the plurality of sites, the object for communicating with the ATE software site management infrastructure to determine which sites are active.

12. The system of claim 10, wherein using the object during testing comprises one or more of:
programming the ATE via the object;
storing instrument readings from the ATE in the object;
processing the instrument readings using the object; and
recording test results in the object.

13. The system of claim 12, wherein processing comprises changing the instrument readings and/or reporting the readings to a testing subsystem.

14. The system of claim 10, wherein the object is defined in a programming language that is programmed on the processing device, the object being treatable by the programming language as a single data element is treated in the programming language.

15. The system of claim 10, wherein the data comprises Boolean data that identifies which sites are active.

16. The system of claim 10, wherein the data comprises pin list data, the pin list data comprising pin data corresponding to instrument measurements on individual pins of at least one DUT.

17. The system of claim 10, wherein the object is defined in a programming language that is programmed on the processing device, and
wherein the processing device executes instructions to define an operation in the programming language, the operation being specific to the object.

18. The system of claim 17, wherein the operation comprises a mathematical operation that corresponds to a mathematical operation performed on a native variable in the programming language.

* * * * *